United States Patent
Lee et al.

(10) Patent No.: US 7,427,533 B2
(45) Date of Patent: Sep. 23, 2008

(54) METHODS OF FABRICATING SEMICONDUCTOR DEVICES INCLUDING TRENCH DEVICE ISOLATION LAYERS HAVING PROTECTIVE INSULATING LAYERS AND RELATED DEVICES

(75) Inventors: Wook-Hyoung Lee, Gyeonggi-do (KR); Jae-Hoon Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 182 days.

(21) Appl. No.: 11/443,237

(22) Filed: May 30, 2006

(65) Prior Publication Data

US 2006/0286713 A1 Dec. 21, 2006

(30) Foreign Application Priority Data

Jun. 15, 2005 (KR) .................. 10-2005-0051480

(51) Int. Cl.
*H01L 21/44* (2006.01)
*H01L 21/48* (2006.01)
*H01L 21/50* (2006.01)

(52) U.S. Cl. .................. 438/106; 438/257; 257/288

(58) Field of Classification Search ............... 438/257, 438/258, 264, 618, 106; 257/288, 315, 374
See application file for complete search history.

(56) References Cited

U.S. PATENT DOCUMENTS

| | | | |
|---|---|---|---|
| 6,040,232 A | 3/2000 | Gau | |
| 6,265,743 B1 | 7/2001 | Sakai et al. | |
| 6,323,107 B1 * | 11/2001 | Ueda et al. | 438/435 |
| 6,927,447 B2 * | 8/2005 | Choi et al. | 257/315 |
| 2006/0128099 A1 * | 6/2006 | Kim et al. | 438/258 |
| 2006/0292793 A1 * | 12/2006 | Sandhu et al. | 438/257 |

FOREIGN PATENT DOCUMENTS

| | | |
|---|---|---|
| KR | 1020010008579 A | 2/2001 |
| KR | 1020030000951 A | 1/2003 |
| KR | 1020030050096 A | 6/2003 |
| KR | 1020030053314 A | 6/2003 |
| KR | 1020040001469 A | 1/2004 |

OTHER PUBLICATIONS

Notice to File a Response/Amendment to the Examination Report corresponding to Korean Patent Application No. 10-2005-0051480 mailed Sep. 26, 2006.

* cited by examiner

*Primary Examiner*—Phuc T Dang
(74) *Attorney, Agent, or Firm*—Myers Bigel Sibley & Sajovec, PA

(57) ABSTRACT

A method of fabricating a semiconductor device includes forming an active region including opposing sidewalls and a surface therebetween protruding from a substrate. A protective insulating layer is formed on the sidewalls of the active region, and extends away from the substrate to beyond the surface of the active region. A device isolation layer is also formed on the opposing sidewalls of the active region, and extends along the protective insulating layer to beyond the surface of the active region. As such, the protective insulating layer may protect portions of the device isolation layer extending therealong during subsequent fabrication processes. Related devices are also discussed.

13 Claims, 10 Drawing Sheets

METHODS OF FABRICATING SEMICONDUCTOR DEVICES INCLUDING TRENCH DEVICE ISOLATION LAYERS HAVING PROTECTIVE INSULATING LAYERS AND RELATED DEVICES

CROSS-REFERENCE TO RELATED APPLICATIONS

This application claims priority from Korean Patent Application No. 10-2005-0051480, filed on Jun. 15, 2005, in the Korean Intellectual Property Office, the disclosure of which is hereby incorporated by reference herein in its entirety.

FIELD OF THE INVENTION

The present invention relates to semiconductor devices, and more particularly, to methods of fabricating semiconductor devices including trench-type device isolation layers and related devices.

BACKGROUND OF THE INVENTION

As semiconductor devices becomes more highly integrated, trench-type device isolation layers may be used for isolating devices. A trench-type device isolation layer may be formed by forming a trench defining an active region in a region of a semiconductor substrate, and filling the trench with an insulating layer. In comparison with a conventional local oxidation of silicon (LOCOS) isolation layer (in which a "bird's beak" phenomenon may occur), it may be possible to form the trench device isolation layer with a narrower linewidth, so that it may be used in highly integrated semiconductor devices.

A flash memory device may also employ the trench device isolation layer to provide higher integration. The flash memory device may have nonvolatile characteristics such that stored data may be retained even if power thereto is interrupted, as charges may be stored in a floating gate that may be electrically isolated. A conventional method of forming a flash memory device including a trench device isolation layer will be illustrated with reference to FIGS. 1 to 4.

FIGS. 1 to 4 are cross-sectional views illustrating conventional methods of forming flash memory devices having a trench device isolation layer.

Referring to FIG. 1, a buffer oxide layer 2 and a hard mask layer 3 are formed on a semiconductor substrate 1 in sequence. Thereafter, the hard mask layer 3, the buffer oxide layer 2 and the semiconductor substrate 1 are successively patterned to form a trench 4 which defines an active region. The buffer oxide layer 2 may be formed through an oxidation process, and the hard mask layer 3 may be a silicon nitride layer. An oxide layer is deposited over an entire surface of the semiconductor substrate 1 to fill the trench 4. Afterwards, the oxide layer is planarized until the patterned hard mask layer 3 is exposed, to thereby form a device isolation layer 5 which fills the trench 4. For example, the device isolation layer 5 may be a silicon oxide layer formed by a chemical vapor deposition (CVD) process using high-density plasma (HDP).

Referring to FIGS. 2 and 3, the exposed hard mask layer 3 is removed by a wet etching process to expose the patterned buffer oxide layer 2. Thereafter, the exposed buffer oxide layer 2 is also removed by a wet etching process so as to expose the surface of the active region. The buffer oxide layer 2 may be removed by wet etching to reduce the likelihood of damage to the surface of the active region.

While performing the wet etching process (which may be an isotropic etching process) to remove the buffer oxide layer 2, the device isolation layer 5 formed of the silicon oxide layer may also be etched. For example, the buffer oxide layer 2 may be formed by thermal oxidation, and the device isolation layer 5 may be formed of silicon oxide by a CVD process. Accordingly, the device isolation layer 5 may be etched faster than the buffer oxide layer 2 during the wet etching process. Typically, because the silicon oxide layer formed by the oxidation process may have a denser structure than the silicon oxide layer formed by the CVD process, the buffer oxide layer 2 may have a slower etch rate in comparison with the device isolation layer 5 formed by the CVD process.

Because wet etching may be isotropic, and the etch rate of the device isolation layer 5 may be faster than that of the buffer oxide layer 2, a "dent" 6 may be formed at an edge of the device isolation layer 5, as illustrated in FIG. 3. The dent 6 may be formed on the edge of the device isolation layer 5 adjacent to the active region.

Referring to FIG. 4, a tunnel oxide layer 7, a floating gate 8, an oxide-nitride-oxide (ONO) layer 9, and a control gate electrode 10 are formed on the active region in sequence. At this time, the dent 6 may be filled by a bottom portion of the floating gate 8. The portion 11 of the floating gate 8, that may fill the dent 6, may be relatively sharp. Due to the sharp portion 11 of the floating gate 8, operation of the flash memory cell may fail. For example, an electric field may be concentrated at the sharp portion 11 of the floating gate 8. Therefore, when erasing data of the flash memory cell by Fowler-Nordheim (F-N) tunneling, the data may be over-erased due to the sharp portion 11 of the floating gate 8. In addition, as read/write operations are repeated, the sharp portion 11 and/or the tunnel oxide layer 7 adjacent to the sharp portion 11 may be deteriorated, such that the reliability of the flash memory cell may be reduced. This phenomenon may also occur at an edge of the active region. That is, the floating gate 8 may be formed in such a shape that it surrounds the edge of the active region adjacent to the device isolation layer 5. The edge of the active region may be formed in an angular shape due to etching of the trench 4. Accordingly, the electric field may also be concentrated at the angular edge of the active region. Therefore, data may be over-erased due to the angular edge of the active region, and the characteristics of the tunnel oxide layer 7 around the angular edge may be deteriorated.

SUMMARY OF THE INVENTION

Some embodiments of the present invention provide methods of forming a semiconductor device. The methods may include: patterning a buffer insulating layer, a buffer silicon layer and a hard mask layer which are sequentially stacked on a substrate, to expose a predetermined region of the substrate; etching the exposed substrate to form a trench defining an active region; recessing a side surface of the patterned buffer insulating layer to form an undercut region; performing a first oxidation process over the substrate to form a first oxide layer; removing the first oxide layer; performing a second oxidation process over the substrate to form a second oxide layer; forming a device isolation layer filling the trench; and removing the patterned hard mask, the patterned buffer silicon layer and the patterned buffer insulating layer in sequence to expose the active region.

In some embodiments of the present invention, the method may further include: forming a tunnel insulating layer on the exposed active region; forming a preliminary floating gate on the tunnel oxide layer, wherein the preliminary floating gate fills a cavity region surrounded by an upper portion of the device isolation layer which is higher than the top surface of the substrate; forming a blocking insulating layer and a control gate conductive layer on the entire surface of the substrate in sequence; and patterning the control gate conductive layer, the blocking insulating layer and the preliminary floating gate successively to form a floating gate, a blocking insulating pattern and a control gate electrode which are stacked in sequence. The method may further include selectively recessing the device isolation layer to expose the side surface of the preliminary floating gate, before the forming of the blocking insulating layer. The forming of the preliminary floating gate may include: forming a floating gate conductive layer, which fills the cavity region, over the entire surface of the substrate; and planarizing the floating gate conductive layer until the device isolation layer is exposed, to form the preliminary floating gate.

In other embodiments, the buffer silicon layer may have higher oxidation rate than that of the substrate. In this case, the second oxide layer formed on the surface of the patterned buffer silicon layer is formed thicker than the second oxide layer formed on the substrate. The substrate may be a single crystal silicon substrate, and the buffer silicon layer may be formed of at least one selected from the group consisting of a doped polysilicon layer, an undoped polysilicon layer, a doped amorphous silicon layer, and an undoped amorphous silicon layer using a chemical vapor deposition (CVD) process. In further embodiments, at least one of the first and second oxidation processes may be a radical oxidation process using a source gas having an oxygen gas in radical state. In particular, the first oxidation process may be the radical oxidation process. At this time, the first oxide layer is formed on side and bottom surfaces of the trench, on the exposed surface of the patterned buffer silicon layer, and on the exposed surface of the patterned hard mask layer. In this case, the first oxide layers formed on side and bottom surfaces of the trench, on the exposed surface of the patterned buffer silicon layer, and on the exposed surface of the patterned hard mask layer may be all removed, when removing the first oxide layer.

In yet other embodiments, the second oxide layer may be formed such that it substantially fills the undercut region. The second oxide layer formed on an edge of the active region may be formed thicker than the buffer insulating layer. The second oxide layer may be formed thicker than the first oxide layer. The edge of the active region may become rounded through the first and second oxidation processes. The buffer insulating layer may be removed by wet etching.

According to further embodiments of the present invention, a method of fabricating a semiconductor device may include forming an active region including opposing sidewalls and a surface therebetween protruding from a substrate. A protective insulating layer may be formed on the sidewalls of the active region and extending away from the substrate to beyond the surface of the active region. A device isolation layer may be formed on the opposing sidewalls of the active region and extending along the protective insulating layer to beyond the surface of the active region.

In some embodiments, the protective insulating layer may be formed to extend on at least a portion of the surface of the active region between the opposing sidewalls thereof.

In other embodiments, a mask pattern may be formed on the substrate, and the substrate may be patterned using the mask pattern to define the active region. The mask pattern and the active region may be oxidized to form the protective insulating layer on the sidewalls of the active region and on sidewalls of the mask pattern extending away from the substrate beyond the surface of the active region.

In some embodiments, the mask pattern and the active region may be oxidized by performing a first oxidation step to form a first oxide layer on the sidewalls of the active region and on the sidewalls of the mask pattern. At least a portion of the first oxide layer may be removed from the sidewalls of the active region and the sidewalls of the mask pattern. A second oxidation step may be performed to form the protective insulating layer on the sidewalls of the active region and on the sidewalls of the mask pattern. For example, the protective insulating layer may be formed thicker than the first oxide layer. Also, the second oxidation step may further round edges of the surface of the active region between the opposing sidewalls thereof relative to performing the first oxidation step.

In other embodiments, the first oxidation step and/or the second oxidation step may employ thermal oxidation and/or radical oxidation. For example, the first oxidation step may include performing radical oxidation to further form the first oxide layer on a surface of the mask pattern between the opposing sidewalls thereof. Portions of the first oxide layer may be removed from the surface and the sidewalls of the mask pattern to reduce a width and/or thickness of the mask pattern.

In some embodiments, the mask pattern and the active region may be oxidized to form portions of the protective insulating layer on the sidewalls of the mask pattern thicker than portions of the protective insulating layer on the sidewalls of the active region.

In other embodiments, in forming the mask pattern, a buffer insulating layer may be formed on the surface of the active region. A buffer silicon layer having a higher oxidation rate than the substrate may be formed on the buffer insulating layer, and a hard mask layer may be formed on the buffer silicon layer. The hard mask layer, the buffer silicon layer, and the buffer insulating layer may be patterned to form the mask pattern. Sidewalls of the buffer silicon layer may be oxidized to form portions of the protective insulating layer thereon thicker than the portions of the protective insulating layer on the sidewalls of the active region.

In some embodiments, prior to oxidizing, the buffer insulating layer may be selectively recessed at sidewalls thereof to define an undercut region exposing a portion of the surface of the active region and a portion of a surface of the buffer silicon layer. As such, the exposed portion of the surface of the active region and the exposed portion of the surface of the buffer silicon layer may be oxidized to substantially fill the undercut region. In addition, the sidewalls and the exposed portion of the surface of the buffer silicon layer may be oxidized to form portions of the protective insulating layer thicker than the buffer insulating layer.

In other embodiments, the buffer silicon layer may include a doped polysilicon layer, an undoped polysilicon layer, a doped amorphous silicon layer, and/or an undoped amorphous silicon layer formed using chemical vapor deposition.

In some embodiments, the hard mask layer and the buffer silicon layer may be selectively removed to define a cavity between portions of the protective insulating layer and to expose the buffer insulating layer. The buffer insulating layer may be isotropically etched to expose the surface of the active region, while the protective insulating layer may protect portions of the device isolation layer extending along the protective insulating layer. For example, the protective insulating layer may have a slower etching rate than the device isolation layer.

In other embodiments, after isotropically etching, an oxide layer may be formed on the exposed surface of the active region adjacent to the protective insulating layer on the sidewalls of the active region. The device isolation layer may be recessed to extend away from the substrate to a substantially similar height as the surface of the active region.

In some embodiments, a gate electrode may be formed in the cavity on the surface of the active region between the opposing sidewalls thereof. For example, a floating gate electrode may be formed in the cavity, and a control gate electrode may be formed on a surface of the floating gate electrode opposite the active region and extending along sidewalls of the floating gate electrode towards the substrate.

According to still further embodiments of the present invention, a semiconductor device may include an active region including opposing sidewalls and a surface therebetween protruding from a surface of a semiconductor substrate, a protective oxide layer on the opposing sidewalls of the active region and the surface of the substrate adjacent thereto, and a device isolation layer on the opposing sidewalls of the active region and the surface of the substrate. As such, the protective oxide layer may extend between the device isolation layer and the active region protruding from the surface of the substrate. The device may further include a gate electrode on the surface of the active region between the opposing sidewalls thereof.

BRIEF DESCRIPTION OF THE DRAWINGS

FIGS. 5A to 12A are plan views illustrating methods of fabricating semiconductor devices including device isolation layers according to some embodiments of the present invention; and FIGS. 5B to 12B are cross-sectional views illustrating methods of fabricating semiconductor devices according to some embodiments of the present invention taken along lines I-I' of FIGS. 5A to 12A, respectively.

DETAILED DESCRIPTION OF EMBODIMENTS OF THE INVENTION

Figure 1:
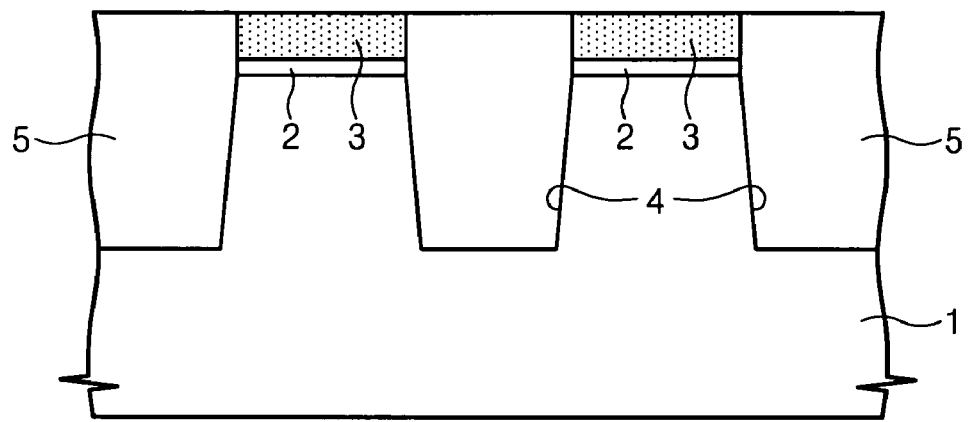
FIGS. 1 to 4 are cross-sectional views illustrating conventional methods of fabricating a flash memory device including a trench-type device isolation layer.
Figure 2:
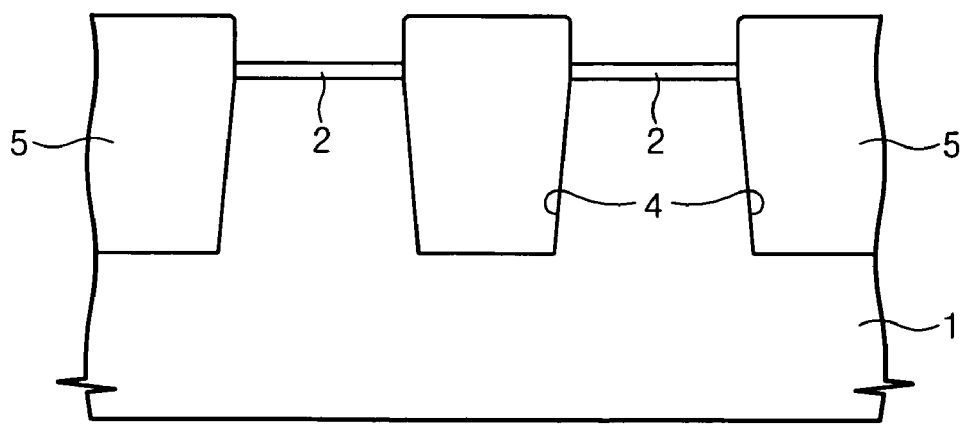
Figure 3:
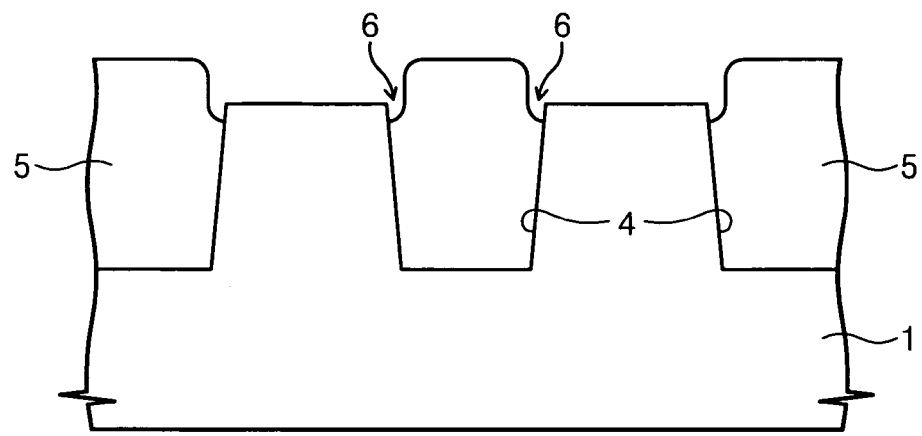
Figure 4:
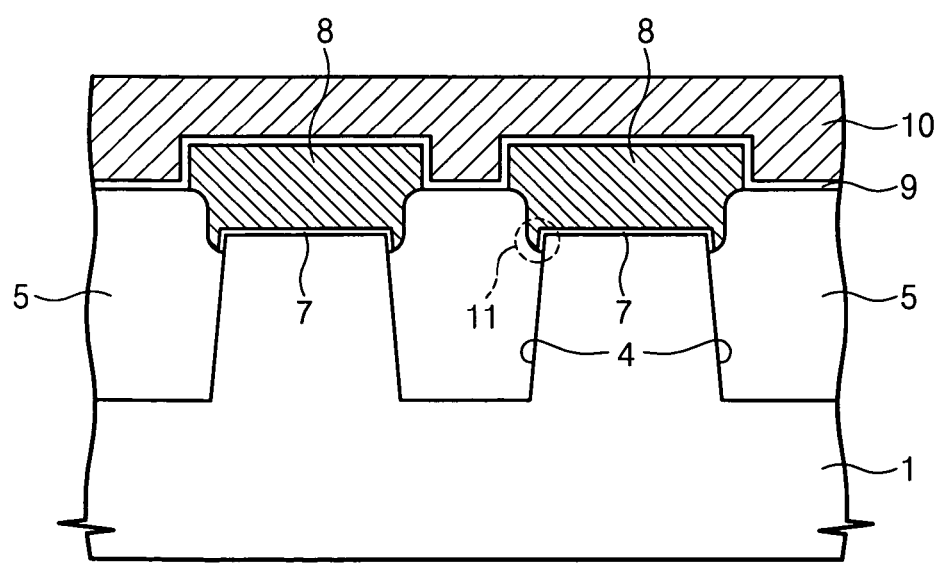

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIGS. 5A to 12A are plan views illustrating methods of forming semiconductor devices including device isolation layers according to some embodiments of the present invention, and FIGS. 5B to 12B are cross-sectional views taken along lines I-I' of FIGS. 5A to 12A, respectively.

Figure 5A:
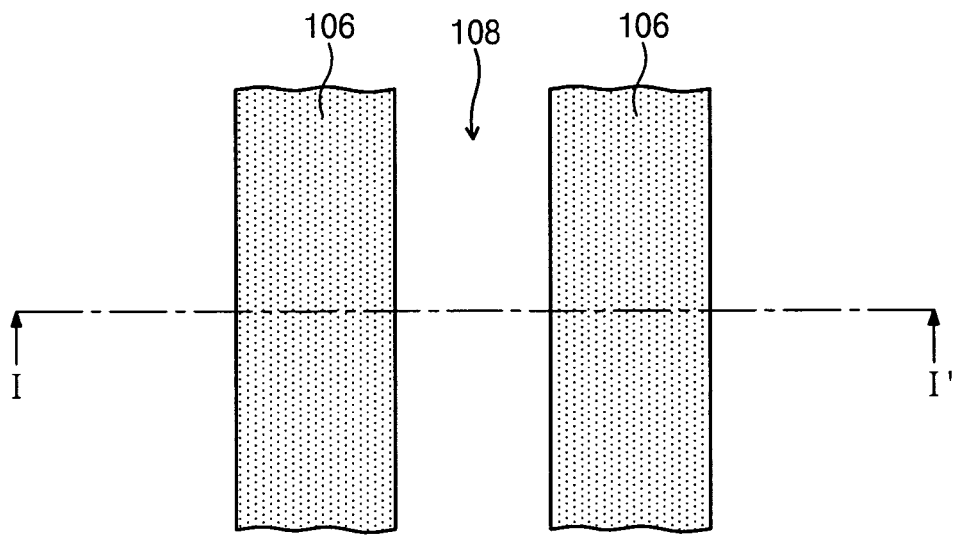
Figure 5B:
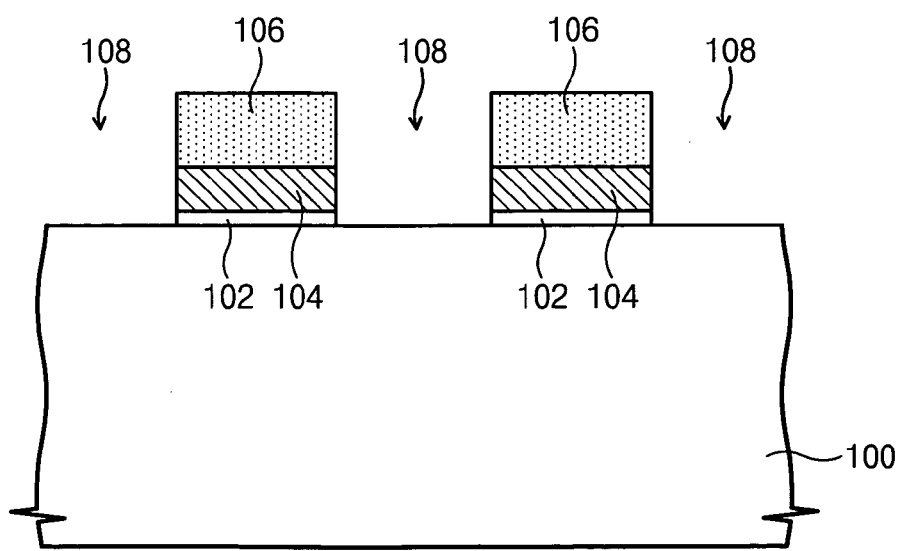

Referring to FIGS. 5A and 5B, a buffer insulating layer 102, a buffer silicon layer 104 and a hard mask layer 106 are sequentially formed on a semiconductor substrate 100 (hereinafter, referred to as 'substrate'). For instance, the substrate 100 may be a silicon substrate. The hard mask layer 106 is formed of a material having a predetermined etch selectivity with respect to the substrate 100. In addition, the hard mask layer 106 may contain silicon atoms. For example, the hard mask layer 106 may be formed of a silicon nitride layer or a silicon oxynitride layer. The buffer silicon layer 104 may have a higher oxidation rate than the substrate 100. That is, the amount of the buffer silicon layer 104 that is oxidized per hour may be greater than the amount of the substrate 100 that is oxidized per hour. For example, the buffer silicon layer 104 may be formed of a doped polysilicon layer, an undoped polysilicon layer, a doped amorphous silicon layer, and/or an undoped amorphous silicon layer. The buffer insulating layer 102 may be formed through a thermal oxidation process. The hard mask layer 106, the buffer silicon layer 104, and the buffer insulating layer 102 are successively patterned to form an opening 108 which exposes a predetermined region of the substrate 100.

Figure 6A:
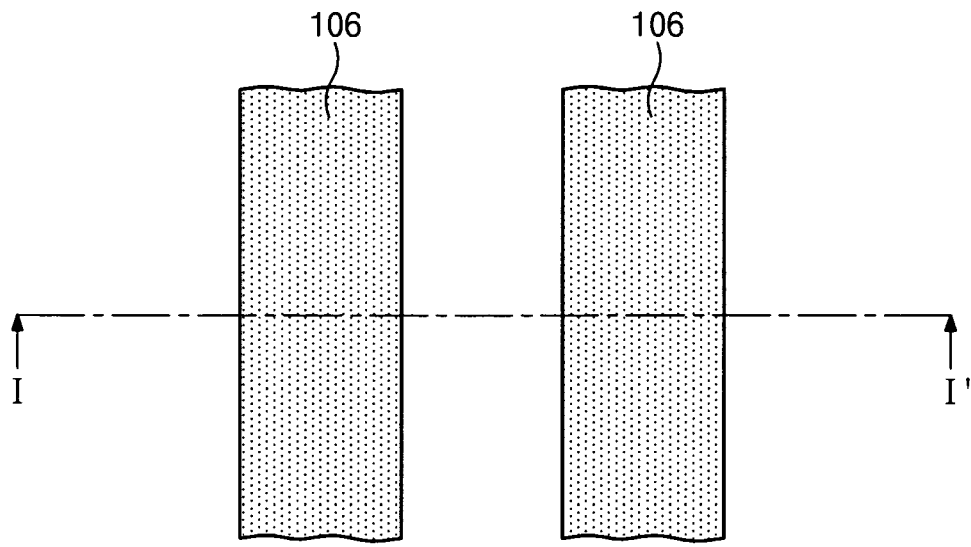
Figure 6B:
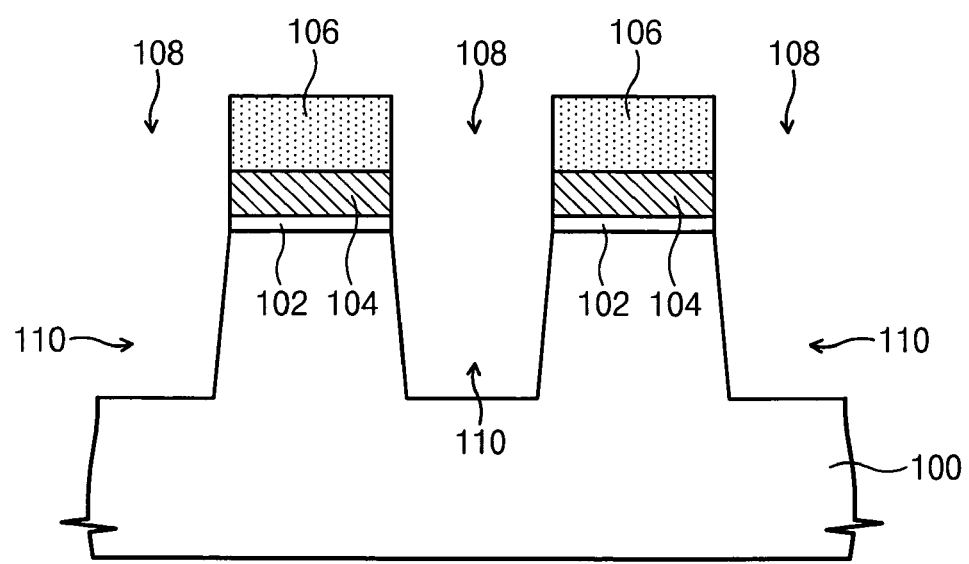

Referring to FIGS. 6A and 6B, the exposed substrate 100 is etched using the patterned hard mask layer 106 as an etch mask, to thereby form a trench 110. The trench 110 defines an active region including opposing sidewalls and a surface therebetween protruding from the substrate 100. The patterned hard mask layer 106, the patterned buffer silicon layer 104 and the patterned buffer insulating layer 102 cover the surface of the active region between the opposing sidewalls.

Figure 7A:
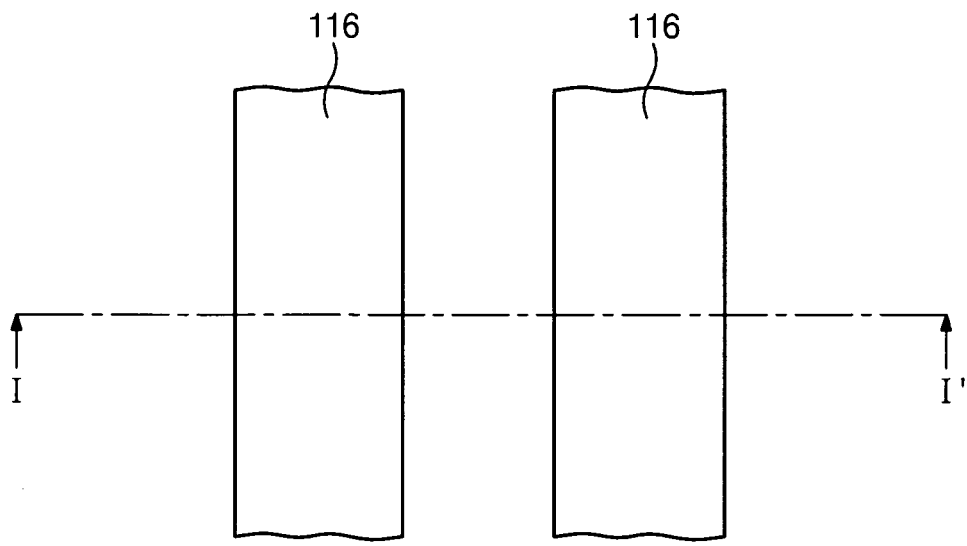
Figure 7B:
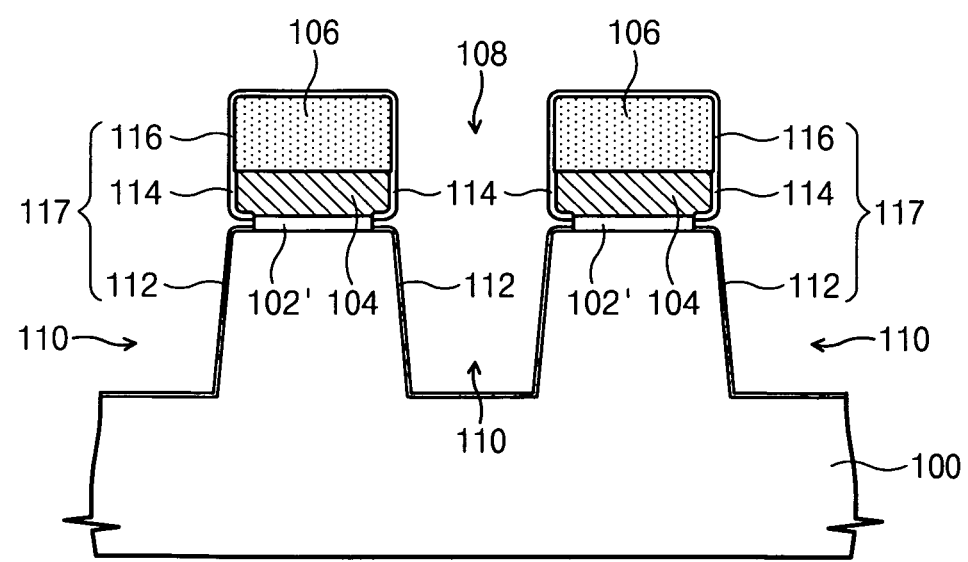

Referring to FIGS. 7A and 7B, a selective isotropic etching process is performed to recess the patterned buffer insulating layer 102. Therefore, an undercut region is formed under an edge of the patterned buffer silicon layer 104. Accordingly, an edge of the top surface of the active region and an edge of the bottom surface of the patterned buffer silicon layer 104 are exposed on both sides of the recessed buffer insulating layer 102'.

Thereafter, a first oxidation process is performed to form a first oxide layer 117. The first oxide layer 117 includes a first portion 112 on the substrate on sidewalls of the active region and bottom surfaces of the trench 110, and a second portion 114 extending beyond the surface of the active region on sidewalls and the exposed surface of the patterned buffer silicon layer 104. Because the buffer silicon layer 104 has a higher oxidation rate than the substrate 100, the second portion 114 of the first oxide layer 117 is formed thicker than the first portion 112.

While performing the first oxidation process, angular edges of the active region exposed by the undercut region may be gradually oxidized. Thus, the angular shape of the edges of the active region may become somewhat dulled. However, it may be difficult to round the edges of the active region through only a single oxidation process. Meanwhile, to minimize losses due to the oxidation of the active region, the first oxide layer 117 may be formed relatively thin. For example, the first portion 112 of the first oxide layer 117 may be formed to a thickness of about a few angstroms to about a few tens of angstroms.

The first oxidation process may be a thermal oxidation process and/or a radical oxidation process. For example, when the first oxidation process is a radical oxidation process, the radical oxidation process may be performed using a source gas including oxygen gas in radical state, i.e., oxygen radicals. More specifically, the radical oxidation process may be performed such that the source gas including oxygen radicals is injected into a process chamber (e.g., furnace, etc.), where the substrate 100 is loaded and the heat energy is supplied.

According to some methods of forming oxygen radicals, a source gas including the oxygen gas may be ionized outside the process chamber. For example, the source gas may be ionized by microwave irradiation. The ionized source gas includes oxygen ions and oxygen radicals. The oxygen ions may be separated from the source gas (for example, using an electromagnetic field) so that the oxygen radicals are injected into the process chamber. In addition, other ionic components incorporated in the source gas may also be filtered and/or otherwise eliminated before injecting the source gas into the process chamber.

According to other methods of forming oxygen radicals, the source gas including the oxygen gas may be irradiated by ultraviolet (UV) radiation. The ultraviolet (UV) irradiation of the source gas may be performed outside the process chamber. Thus, the source gas including the oxygen radicals may be injected into the process chamber.

Further methods of forming oxygen radicals may use partial pressure of the source gases. That is, a source gas including an oxygen gas and a hydrogen gas may be injected into the process chamber. At this time, the pressure in the process chamber may be lower than atmospheric pressure. The hydrogen gas may be injected into the chamber at a flow rate ranging from about 20% to about 40% with respect to an overall flow rate of the source gas (i.e., the total flow rates of the oxygen gas and the hydrogen gas). In addition, the process chamber may be maintained at a relatively high temperature, e.g., at a temperature in a range of about 800° C. (Celsius) to about 1,200° C. Under these conditions, some of the oxygen gases may be excited to the radical state, due to the partial pressure difference between the oxygen and the hydrogen gas and the relatively high temperature. For instance, the oxygen radicals may be formed under conditions where the hydrogen gas is injected at a flow rate of about 33% with respect to the flow rate of the source gas and the process temperature is maintained at about 900° C.

Through the radical oxidation process, the sidewalls of the hard mask layer 106 (which may be formed of silicon nitride) may also be oxidized. In addition, when the first oxidation process is a radical oxidation process, the first oxide layer 117 may include the first and second portions 112 and 114, and a third portion 116 formed on an exposed surface of the patterned hard mask layer 106 between the opposing sidewalls.

On the other hand, if the first oxidation process is a thermal oxidation process, the first oxide layer 117 may include only the first and second portions 112 and 114.

Figure 8A:
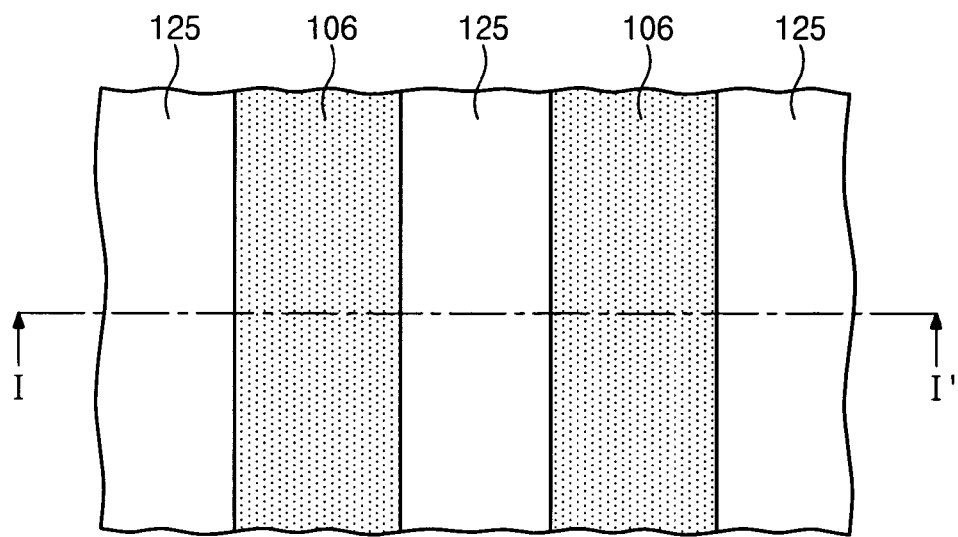
Figure 8B:
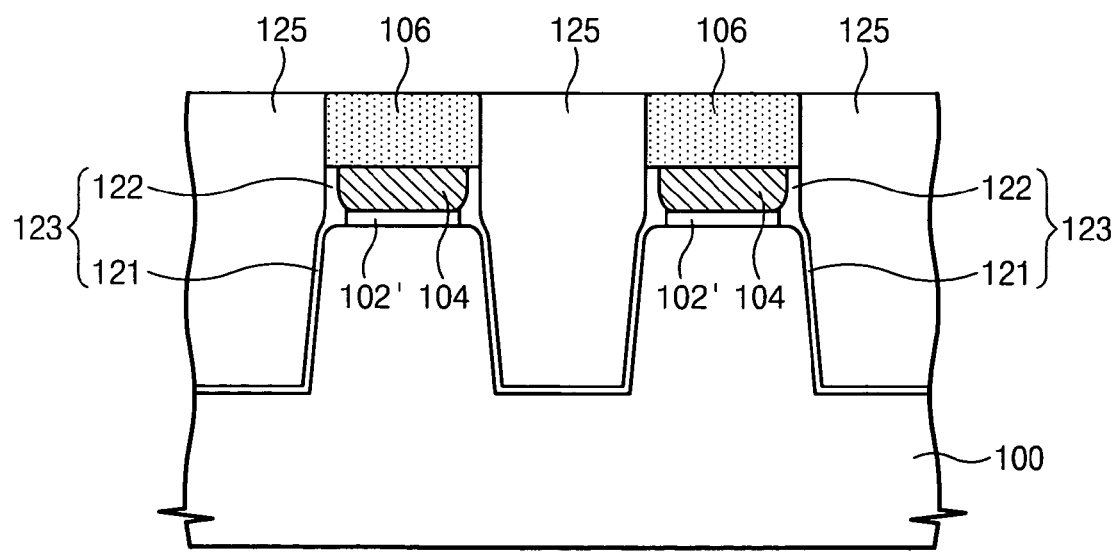

Referring to FIGS. 8A and 8B, an isotropic wet etching process is performed on the substrate 100 to remove the first oxide layer 117. At this time, if the first oxidation process employed a radical oxidation process (i.e., so that the first oxide layer 117 includes the first portion 112, the second portion 114 and the third portion 116), the first, second and third portions 112, 114 and 116 are removed through the isotropic wet etching process. As described above, when the first oxidation process is a radical oxidation process, the surface of the patterned hard mask layer 106 is oxidized to form the third portion 116 of the first oxide layer 117. As such, is the third portion 110 is also removed when removing the first oxide layer 117. Accordingly, the width and/or thickness of the patterned hard mask layer 106 may be reduced, which may reduce the aspect ratio or depth of the opening 108.

Subsequently, a second oxidation process is performed on the substrate 100 to thereby form a second oxide layer 123 (also referred to hereinafter as a "protective insulating layer" or "protective oxide layer"). The second oxide layer 123 includes a first portion 121 formed on sidewalls of the active region and bottom surfaces of the trench, and a second portion 122 formed on sidewalls and other exposed surfaces of the patterned buffer silicon layer 104 to extend away from the substrate 100 beyond the surface of the active region. At this time, the first and second portions 121 and 122 may be connected to each other, so as to substantially fill the undercut region.

Because of the higher oxidation rate of the buffer silicon layer 104 as compared to the substrate 100, the second portion 122 of the second oxide layer 123 may be formed thicker than the first portion 121. Also, the second oxide layer 123 may be formed thicker than the first oxide layer 117.

Accordingly, the second oxide layer 123 formed on the sidewalls of the active region includes the first portion 121 formed by oxidizing the sidewalls of the protruding portion of the substrate 100 that defines the active region, and the second portion 122 formed by oxidizing the sidewalls of the patterned buffer silicon layer 104. Accordingly, it may be possible to minimize the oxidation loss of the active region by forming the second oxide layer 123 as thick as or thicker than the recessed buffer insulating layer 102'. In other words, the formation of the second oxide layer 123 may disproportionately consume silicon in the buffer silicon layer 104 due to the higher oxidation rate, thereby reducing and/or minimizing the oxidation loss of the active region. As a result, it may be possible to reduce and/or minimize reduction of the linewidth of the active region. Accordingly, it may be possible to prevent a reduction in turn-on current of a MOS transistor and/or a flash memory cell. In other words, since the buffer silicon layer 104 has higher oxidation rate than the substrate 100, the oxidation loss of the active region may be reduced. In addition, it may be possible to form the second oxide layer 123 thicker than the recessed buffer insulating layer 102' due to the buffer silicon layer 104.

Furthermore, the edge of the active region may become more rounded through the second oxidation process. In other words, after dulling the somewhat angular shape of the edge of the active region through the first oxidation process, the second oxidation process may further round the edge of the active region. As a result, it may be possible to prevent concentration of the electric field due to the rounded edges of the active region. The second oxidation process may be a thermal oxidation process and/or a radical oxidation process. For example, if the second oxidation process is a radical oxidation process, the second oxide layer 123 may also be formed on the surface of the patterned hard mask layer 106.

Still referring to FIGS. 8A and 8B, an insulating layer is formed on the entire surface of the substrate 100 including the second oxide layer 123 to fill the trench 110 and the opening 108. The insulating layer may be formed using a HDP CVD process. The insulating layer may be formed of a silicon oxide layer.

In some embodiments, a liner layer (not shown) may be conformally formed over the substrate 100 having the second oxide layer 123 before forming the insulating layer. The liner layer may be formed of a silicon oxide layer, a silicon nitride layer, or the like. The insulating layer is planarized until the patterned hard mask layer 106 is exposed, to thereby form a device isolation layer 125 filling the trench 110 and the opening 108. As such, the device isolation layer 125 is surrounded by the second oxide layer 123. In particular, at least a portion of the device isolation layer 125 which fills the trench 110 and a portion of the device isolation layer 125 adjacent to the buffer silicon layer 104, are surrounded by the second oxide layer 123, such that the second oxide layer extends between the device isolation layer 125 and the active region. When the second oxidation process is a radical oxidation process, the side and bottom surfaces of the device isolation layer 125 may be surrounded by the second oxide layer 123.

Figure 9A:
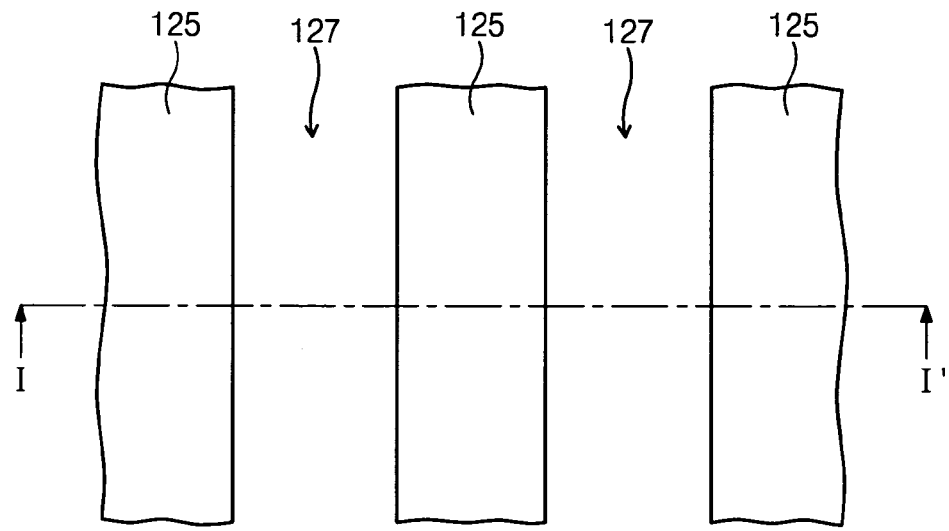
Figure 9B:
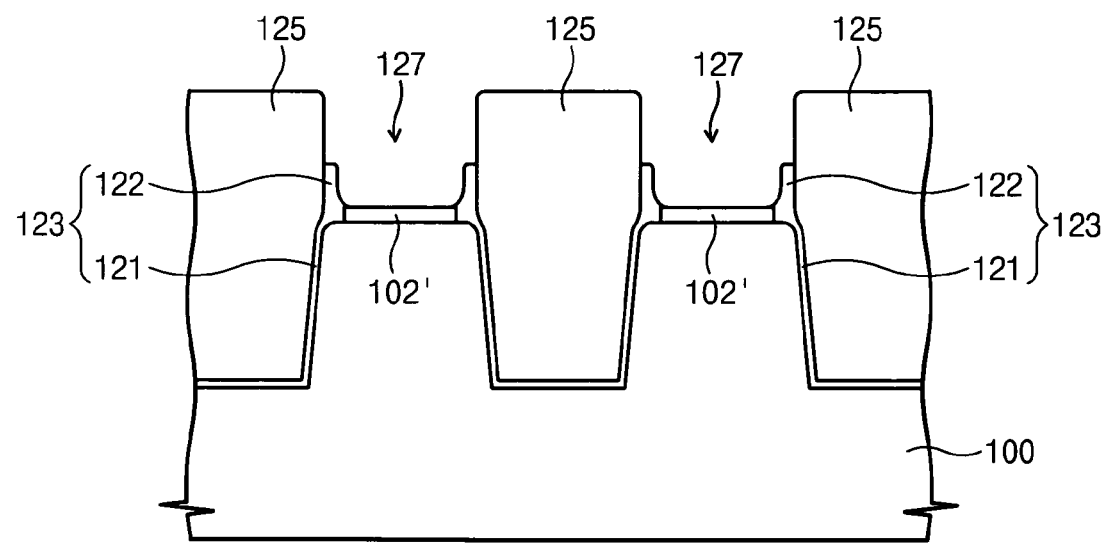

Referring to FIGS. 9A and 9B, the patterned hard mask layer 106 is selectively removed from the substrate 100 having the device isolation layer 125. The patterned hard mask layer 106 may be removed by wet and/or dry etching. Thereafter, the patterned buffer silicon layer 104 is also selectively removed to thereby expose the recessed buffer insulating layer 102' and the second oxide layer 123. The patterned buffer silicon layer 104 may also be removed by wet and/or dry etching.

By removing the patterned hard mask layer 106 and the buffer silicon layer 104, a cavity region 127 is formed, which is surrounded by an upper portion of the device isolation layer 125 extending beyond the surface of the active region.

Figure 10A:
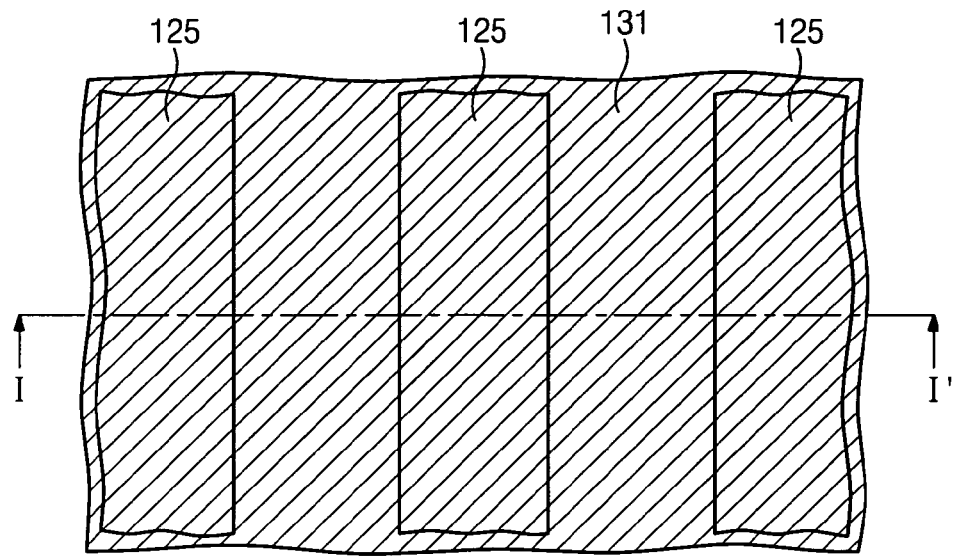
Figure 10B:
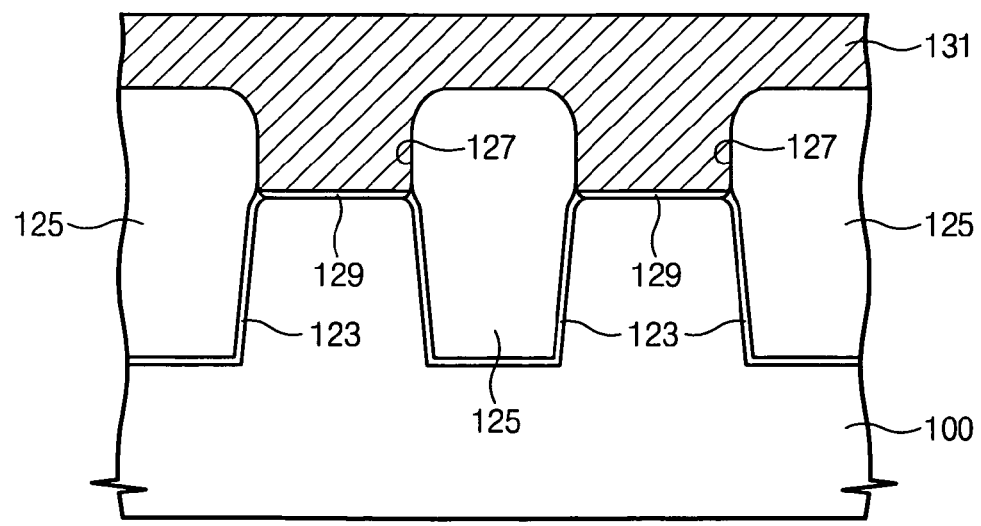

Referring to FIGS. 10A and 10B, the recessed buffer insulating layer 102' is removed by an isotropic wet etching process to thereby expose the surface of the active region. At this time, sidewalls of the device isolation layer 125 are protected by the second oxidation layer 123 extending therealong. In other words, the protective oxide layer 123 formed through the second oxidation process has a slower etch rate in comparison with the device isolation layer 125 formed by the CVD process. Accordingly, because the second oxide layer 123 protects the device isolation layer 125 while removing the buffer insulating layer 102', it may be possible to reduce and/or prevent the occurrence of a "dent" in the device isolation layer 125 adjacent the surface of the active region, which may be a problem in the prior art. The recessed buffer insulating layer 102' may be removed by wet etching so as to reduce and/or avoid damage to the surface of the active region.

In some cases, the recessed buffer insulating layer 102' may be over-etched. Accordingly, by forming the second oxide layer 123 thicker than the recessed buffer insulating layer 102', the formation of a "dent" in the device isolation layer 125 may be reduced and/or prevented.

Afterwards, a tunnel insulating layer 129 is formed on the surface of the exposed active region. The tunnel insulating layer 129 may be formed by thermal oxidation. A floating gate conductive layer 131 is formed on the surface of the substrate 100 including the tunnel insulating layer 129 to substantially fill the cavity region 127. The floating gate conductive layer 131 may be formed of a doped polysilicon layer or an undoped polysilicon layer.

Figure 11A:
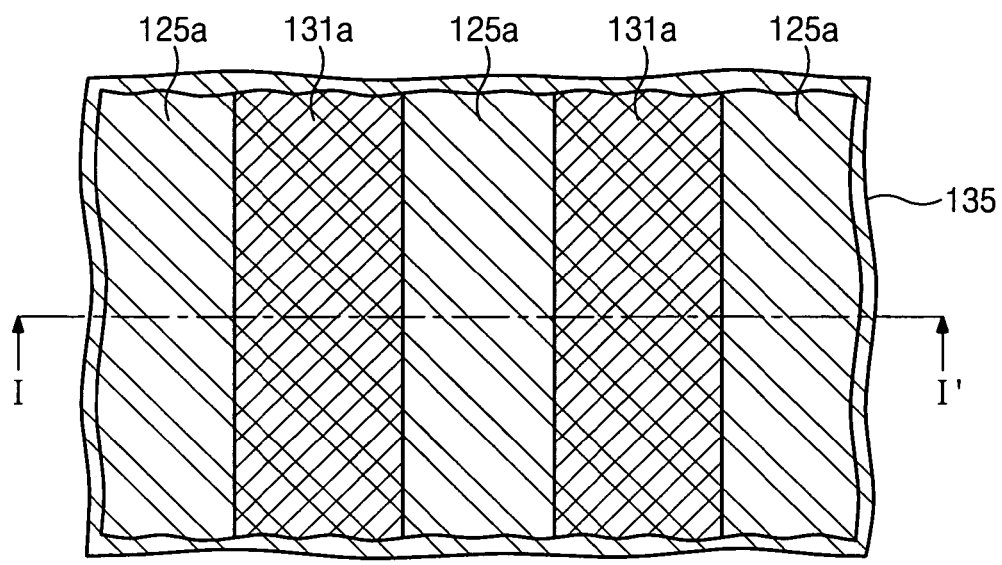
Figure 11B:
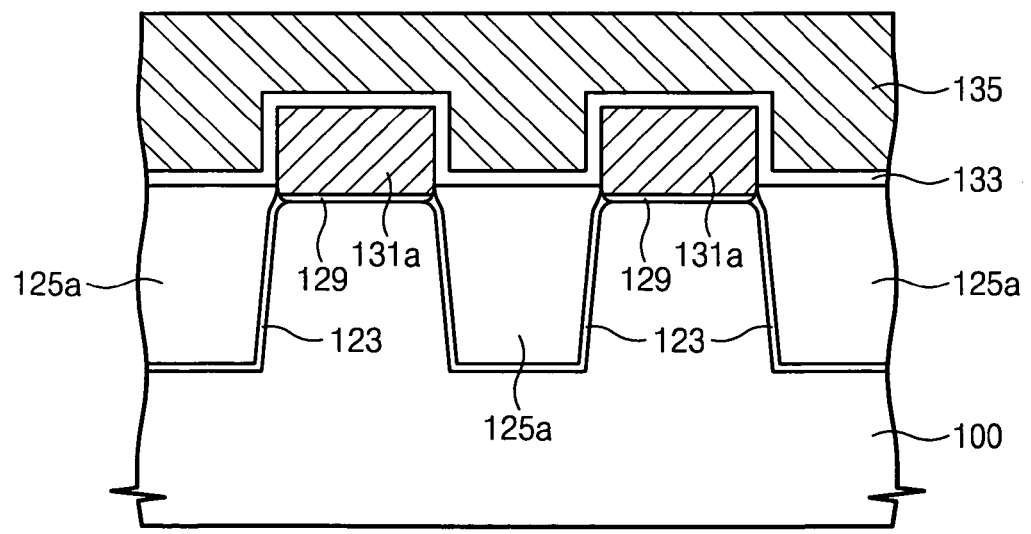

Referring to FIGS. 11A and 11B, the floating gate conductive layer 131 is planarized until the device isolation layer 125 is exposed to form a preliminary floating gate 131a filling the cavity region 127. The preliminary floating gate 131a is formed such that it is self-aligned on the active region based on the cavity region 127.

Subsequently, the exposed device isolation layer 125 is recessed to expose a sidewall of the preliminary floating gate 131a. The top surface of the recessed device isolation layer 125a may be similar in height to that of the surface of the active region, (i.e., the top surface of the substrate 100. Also, the recessed device isolation layer 125a may extend beyond the surface of the active region adjacent to a side surface of the tunnel insulating layer 129. A portion of the etched second oxide layer 123 remaining on the opposing sidewalls of the active region after removing the recessed buffer insulating layer 102 may also extend on the sidewalls of the tunnel insulating layer 129 such that the remaining portion of the second oxide layer 123 is between the recessed device isolation layer 125 and the active region.

A blocking insulating layer 133 is conformally formed on the preliminary floating gate 131a and the surface of the substrate 100 including the recessed device isolation layer 125a. Afterwards, a control gate conductive layer 135 is formed on the blocking insulating layer 133. The control gate conductive layer 135 may be formed such that it substantially covers the sidewalls of the preliminary floating gate 131a.

The blocking insulating layer 133 may have a dielectric constant that is greater than that of the tunnel oxide layer 129. For instance, the blocking insulating layer 133 may be formed of an oxide-nitride-oxide (ONO) layer. Also, the blocking insulating layer 133 may include an insulating metal oxide layer with a relatively high dielectric constant, such as hafnium oxide, zirconium oxide, aluminum oxide, etc. Because the blocking insulating layer 133 has such a high dielectric constant, the coupling ratio of the flash memory cell may be increased, so that it may be possible to reduce an operational voltage thereof.

The control gate conductive layer 135 may include a doped polysilicon layer, a conductive metal nitride layer (e.g., titanium nitride layer, tantalum nitride layer, etc), a metal layer (e.g., tungsten layer, molybdenum layer, etc), and/or a metal silicide layer (e.g., tungsten silicide layer, and a cobalt silicide layer, nickel silicide layer, titanium silicide layer, etc). Although not shown in the drawings, an insulating capping layer may also be formed on the control gate conductive layer 135.

Figure 12A:
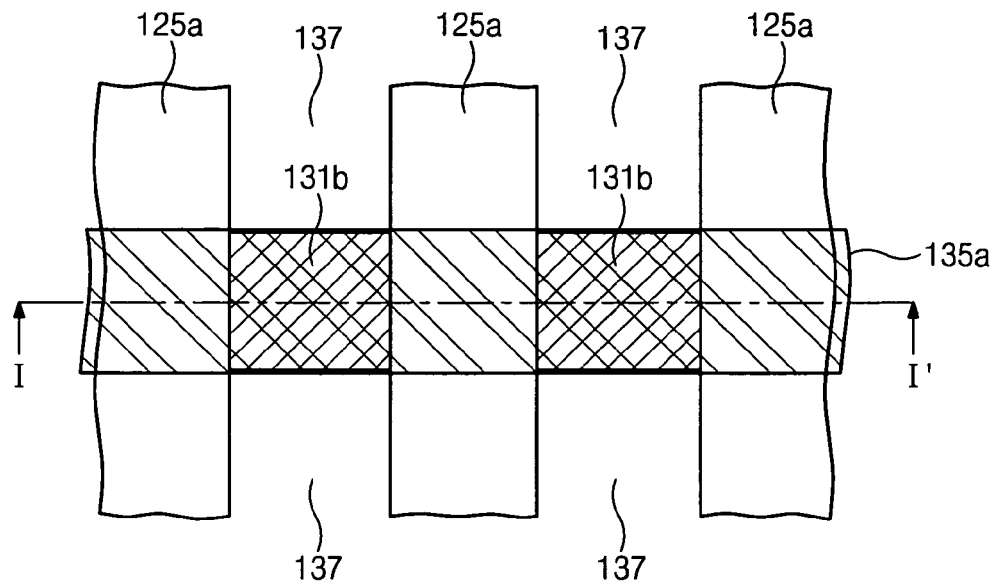
Figure 12B:
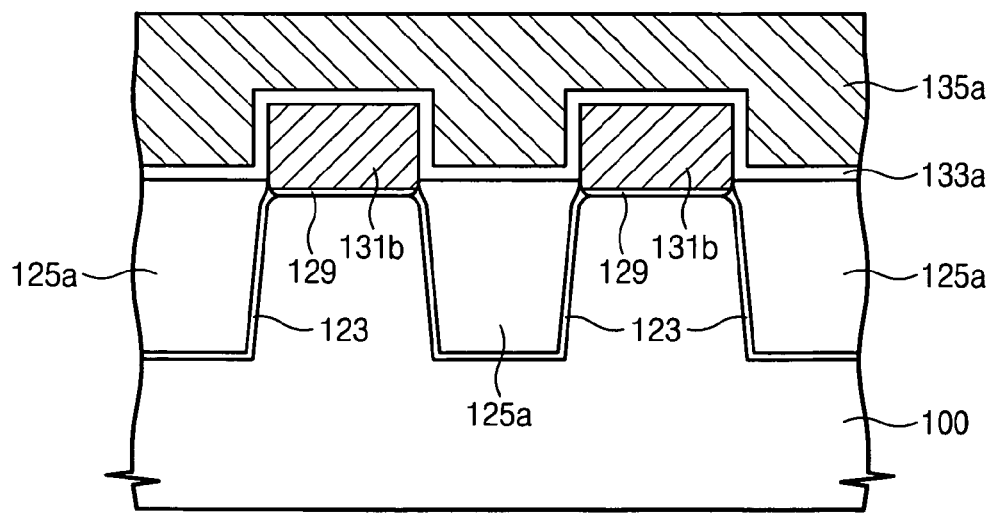

Referring to FIGS. 12A and 12B, the control gate conductive layer 135, the blocking insulating layer 133, and the preliminary floating gate 131a are successively patterned to form a floating gate 131b, a blocking insulating pattern 133a and a control gate electrode 135a stacked in sequence. The floating gate 131b is formed over the active region, and the tunnel insulating layer 129 is interposed therebetween. The control gate electrode 135a substantially covers the top surface and sidewalls of the floating gate 131b, and the blocking insulating pattern 133a is interposed therebetween.

Thereafter, an ion implantation process is performed using the control gate 135a as a mask to form an impurity doped layer 137 in the active region on both sides of the control gate electrode 135a. The impurity doped regions 137 corresponds to source/drain regions. Thus, a nonvolatile memory device is formed, which includes the floating gate 131b, the control gate electrode 135a and the impurity doped layer 137.

In the methods of forming semiconductor devices according to some embodiments of the present invention discussed above, the device isolation layer 125 is protected by the second oxide layer 123. The second oxide layer 123 has a slower etching rate than the device isolation layer 125. Accordingly, it may possible to prevent formation of a "dent" at the edges of the device isolation layer 125 adjacent the surface of the active region. Therefore, the formation of relatively sharp portions of the floating gate may be reduced and/or prevented so that it may be possible to reduce and/or prevent degradation in the reliability of the nonvolatile memory cell.

In addition, the second oxide layer 123 is formed around the edges of the surface of the active region by the oxidation of the buffer silicon layer 104 through the second oxidation process. That is, because the buffer oxide layer 104 is consumed during the second oxidation process at a greater rate than the active region, the oxidation loss of the active region may be reduced and/or minimized. Thus, it may be possible to form the second oxide layer 123 with a sufficient thickness to protect the device isolation layer 125. Therefore, it may be possible to minimize the reduction in linewidth of the active region. Moreover, because the buffer silicon layer 104 has higher oxidation rate than the substrate 100, the oxidation loss of the active region may be further reduced. As a result, it may be possible to prevent the turn-on current of a MOS transistor and/or a flash memory cell from being reduced.

Also, because the first and second oxidation processes are performed, the edges of the active region may gradually become more rounded. Thus, it may be possible to prevent concentration of the electric field at the edges of the active region. As a result, it may be possible to reduce and/or prevent degradation of the reliability of the nonvolatile memory cell.

Furthermore, because the linewidth of the patterned hard mask layer may be reduced by using a radical oxidation process, it may be possible to reduce the aspect ratio of the opening and/or the depth of the trench. As a result, for the formation of voids may be reduced and/or prevented when forming the device isolation layer in the trench 110.

Although described and illustrated above with reference to nonvolatile memory devices including device isolation layers, the present invention is not so limited. For example, a MOS transistor may be formed on the active region defined by the device isolation layer 125 according to some embodiments of the present invention. Therefore, embodiments of the present invention may be applied to DRAM including MOS transistors, ferroelectric memory devices, magnetic memory devices, phase change memory devices, and so forth.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

That which is claimed:

1. A method of forming a semiconductor device, the method comprising:

patterning a buffer insulating layer, a buffer silicon layer and a hard mask layer which are sequentially stacked on a substrate, to expose a predetermined region of the substrate;

etching the exposed substrate to form a trench defining an active region;

recessing a side surface of the patterned buffer insulating layer to form an undercut region;

performing a first oxidation process over the substrate to form a first oxide layer;

removing the first oxide layer;

performing a second oxidation process over the substrate to form a second oxide layer that fills the undercut region;

forming a device isolation layer filling the trench; and removing the patterned hard mask, the patterned buffer silicon layer and the patterned buffer insulating layer in sequence to expose the active region.

2. A method of forming a semiconductor device, the method comprising:

patterning a buffer insulating layer, a buffer silicon layer and a hard mask layer which are sequentially stacked on a substrate, to expose a predetermined region of the substrate;

etching the exposed substrate to form a trench defining an active region;

recessing a side surface of the patterned buffer insulating layer to form an undercut region;

performing a first oxidation process over the substrate to form a first oxide layer;

removing the first oxide layer;
performing a second oxidation process over the substrate to form a second oxide layer;
forming a device isolation layer filling the trench;
removing the patterned hard mask, the patterned buffer silicon layer and the patterned buffer insulating layer in sequence to expose the active region;
forming a tunnel insulating layer on the exposed active region;
forming a preliminary floating gate on the tunnel oxide layer, the preliminary floating gate filling a cavity region surrounded by an upper portion of the device isolation layer which is higher than the top surface of the substrate;
forming a blocking insulating layer and a control gate conductive layer on the entire surface of the substrate in sequence; and
patterning the control gate conductive layer, the blocking insulating layer and the preliminary floating gate successively to form a floating gate, a blocking insulating pattern and a control gate electrode which are stacked in sequence.

3. The method of claim 2, further comprising, before the forming of the blocking insulating layer, selectively recessing the device isolation layer to expose the side surface of the preliminary floating gate.

4. The method of claim 2, wherein the forming of the preliminary floating gate comprises:
forming a floating gate conductive layer, which fills the cavity region, over the entire surface of the substrate; and
planarizing the floating gate conductive layer until the device isolation layer is exposed, to form the preliminary floating gate.

5. A method of forming a semiconductor device, the method comprising:
patterning a buffer insulating layer, a buffer silicon layer and a hard mask layer which are sequentially stacked on a substrate, to expose a predetermined region of the substrate, wherein the buffer silicon layer has higher oxidation rate than that of the substrate;
etching the exposed substrate to form a trench defining an active region;
recessing a side surface of the patterned buffer insulating layer to form an undercut region;
performing a first oxidation process over the substrate to form a first oxide layer;
removing the first oxide layer;
performing a second oxidation process over the substrate to form a second oxide layer, wherein the second oxide layer formed on the surface of the patterned buffer silicon layer is formed thicker than the second oxide layer formed on the substrate;
forming a device isolation layer filling the trench; and
removing the patterned hard mask, the patterned buffer silicon layer and the patterned buffer insulating layer in sequence to expose the active region.

6. The method of claim 5, wherein the substrate is a single crystal silicon substrate, and the buffer silicon layer is formed of at least one selected from the group consisting of a doped polysilicon layer, an undoped polysilicon layer, a doped amorphous silicon layer, and an undoped amorphous silicon layer using a chemical vapor deposition (CVD) process.

7. A method of forming a semiconductor device, the method comprising:
patterning a buffer insulating layer, a buffer silicon layer and a hard mask layer which are sequentially stacked on a substrate, to expose a predetermined region of the substrate;
etching the exposed substrate to form a trench defining an active region;
recessing a side surface of the patterned buffer insulating layer to form an undercut region;
performing a first oxidation process over the substrate to form a first oxide layer;
removing the first oxide layer;
performing a second oxidation process over the substrate to form a second oxide layer, wherein at least one of the first and second oxidation processes is a radical oxidation process using a source gas having an oxygen gas in radical state;
forming a device isolation layer filling the trench; and
removing the patterned hard mask, the patterned buffer silicon layer and the patterned buffer insulating layer in sequence to expose the active region.

8. The method of claim 7, wherein the first oxidation process is the radical oxidation process so that the first oxide layer is formed on side and bottom surfaces of the trench, on the exposed surface of the patterned buffer silicon layer, and on the exposed surface of the patterned hard mask layer.

9. The method of claim 8, wherein the first oxide layers formed on side and bottom surfaces of the trench, on the exposed surface of the patterned buffer silicon layer, and on the exposed surface of the patterned hard mask layer are all removed, when removing the first oxide layer.

10. A method of forming a semiconductor device, the method comprising:
patterning a buffer insulating layer, a buffer silicon layer and a hard mask layer which are sequentially stacked on a substrate, to expose a predetermined region of the substrate;
etching the exposed substrate to form a trench defining an active region;
recessing a side surface of the patterned buffer insulating layer to form an undercut region;
performing a first oxidation process over the substrate to form a first oxide layer;
removing the first oxide layer;
performing a second oxidation process over the substrate to form a second oxide layer, wherein the second oxide layer formed on an edge of the active region is formed thicker than the buffer insulating layer;
forming a device isolation layer filling the trench;
removing the patterned hard mask, the patterned buffer silicon layer and the patterned buffer insulating layer in sequence to expose the active region.

11. The method of claim 1, wherein the second oxide layer is formed thicker than the first oxide layer.

12. The method of claim 1, wherein the edge of the active region becomes round through the first and second oxidation processes.

13. The method of claim 1, wherein the buffer insulating layer is removed by wet etching.

* * * * *

UNITED STATES PATENT AND TRADEMARK OFFICE
CERTIFICATE OF CORRECTION

PATENT NO. : 7,427,533 B2  Page 1 of 1
APPLICATION NO. : 11/443237
DATED : September 23, 2008
INVENTOR(S) : Lee et al.

It is certified that error appears in the above-identified patent and that said Letters Patent is hereby corrected as shown below:

In the Claims:

Column 14, Claim 10, Line 51: Please correct "layer tilling the trench"
 To read -- layer filling the trench --

Column 14, Claim 10, Line 52: Please correct "patterned bard mask"
 To read -- patterned hard mask --

Signed and Sealed this

Second Day of December, 2008

JON W. DUDAS
*Director of the United States Patent and Trademark Office*